United States Patent
Gong et al.

(10) Patent No.: US 8,841,167 B1
(45) Date of Patent: Sep. 23, 2014

(54) MANUFACTURING METHOD OF A SEMICONDUCTOR PACKAGE OF SMALL FOOTPRINT WITH A STACK OF LEAD FRAME DIE PADDLE SANDWICHED BETWEEN HIGH-SIDE AND LOW-SIDE MOSFET

(71) Applicants: Yuping Gong, Shanghai (CN); Yan Xun Xue, Los Gatos, CA (US); Liang Zhao, Shanghai (CN)

(72) Inventors: Yuping Gong, Shanghai (CN); Yan Xun Xue, Los Gatos, CA (US); Liang Zhao, Shanghai (CN)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 13/951,772

(22) Filed: Jul. 26, 2013

(51) Int. Cl.
*H01L 21/50* (2006.01)
*H01L 21/56* (2006.01)
*H01L 23/495* (2006.01)
*H01L 25/065* (2006.01)
*H01L 23/00* (2006.01)
*H01L 25/18* (2006.01)

(52) U.S. Cl.
CPC .......... *H01L 21/56* (2013.01); *H01L 23/49562* (2013.01); *H01L 25/0657* (2013.01); *H01L 24/81* (2013.01); *H01L 25/18* (2013.01); *H01L 23/49575* (2013.01); *H01L 24/34* (2013.01)
USPC ..... 438/108; 438/106; 438/107; 257/E23.044

(58) Field of Classification Search
CPC ..... H01L 25/18; H01L 25/0657; H01L 25/50; H01L 23/49575; H01L 23/49562; H01L 24/34; H01L 24/81; H01L 21/16; H01L 21/56
USPC .......... 438/108, 106, 107, 124, 127; 257/E23.044
See application file for complete search history.

(56) References Cited

U.S. PATENT DOCUMENTS

| | | | |
|---|---|---|---|
| 7,271,477 B2 * | 9/2007 | Saito et al. | 257/686 |
| 8,436,429 B2 * | 5/2013 | Xue et al. | 257/401 |
| 8,686,546 B2 * | 4/2014 | Ho et al. | 257/676 |
| 2001/0052641 A1 * | 12/2001 | Kuo et al. | 257/686 |
| 2011/0227207 A1 * | 9/2011 | Yilmaz et al. | 257/676 |
| 2012/0217556 A1 * | 8/2012 | Kajiwara et al. | 257/288 |
| 2012/0248539 A1 * | 10/2012 | Zhang et al. | 257/368 |

* cited by examiner

*Primary Examiner* — Michael Trinh
(74) *Attorney, Agent, or Firm* — Chein-Hwa Tsao; CH Emily LLC

(57) ABSTRACT

A semiconductor package method for co-packaging high-side (HS) and low-side (LS) semiconductor chips is disclosed. The HS and LS semiconductor chips are attached to two opposite sides of a lead frame, with a bottom drain electrode of the LS chip connected to a top side of the lead frame and a top source electrode of the HS chip connected to a bottom side of the lead frame through a solder ball. The stacking configuration of HS chip, lead frame and LS chip reduces the package size. A bottom metal layer covering the bottom of HS chip exposed outside of the package body provides both electrical connection and thermal conduction.

8 Claims, 6 Drawing Sheets

MANUFACTURING METHOD OF A SEMICONDUCTOR PACKAGE OF SMALL FOOTPRINT WITH A STACK OF LEAD FRAME DIE PADDLE SANDWICHED BETWEEN HIGH-SIDE AND LOW-SIDE MOSFET

CROSS REFERENCE TO RELATED APPLICATIONS

This application is a divisional application of a pending US patent application entitled "SEMICONDUCTOR PACKAGE OF SMALL FOOTPRINT WITH A STACK OF LEAD FRAME DIE PADDLE SANDWICHED BETWEEN HIGH-SIDE AND LOW-SIDE MOSFETS AND MANUFACTURING METHOD" by YuPing Gong et al with application Ser. No. 13/302,077, and filing date of Nov. 22, 2011 whose content is hereby incorporated by reference for all purposes.

PRIORITY CLAIM

This application claims the priority benefit of Chinese patent application number 201110310147.7 filed Sep. 28, 2011, the entire disclosures of which are incorporated herein by reference.

FIELD OF THE INVENTION

This invention relates to a semiconductor package and its manufacturing method, in particular, of a semiconductor package including high-side (HS) and low-side (LS) semiconductor chips.

BACKGROUND OF THE INVENTION

In applications of power transistors, for example metal-oxide-semiconductor field effect transistors (MOSFETs), the heat dissipation and package size are two important parameters of the devices. Device's heat dissipation is improved by exposing the source and/or drain of the transistor, but the implementation process is very complicated.

In some switching circuits, such as synchronous buck converter, half-bridge converter and inverter, two power MOSFETs are needed for switching in a complementary manner. The switching circuit as shown in FIG. 1 includes two MOSFETs, which is HS MOSFET 1 and LS MOSFET 2, connected in series to a voltage source 3, in which, the source of HS MOSFET 1 is connected to the drain of LS MOSFET 2 through a plurality of parasitic inductances such as LDHS, LSHS, LDLS and LSLS.

For these devices, when the HS chip and LS chip are co-packaged and two chips are connected by lead wire, the lead inductance is reduced. However, the HS chip and LS chip are arranged side by side on one side of a lead frame, thus the whole device has a large size.

DETAILED DESCRIPTION OF THE EMBODIMENTS

Specific embodiments of this invention will be described as follows with illustration drawings.

As shown in FIG. 2 to FIG. 11, this invention relates to a semiconductor package including co-packaged HS and LS semiconductor chips and its manufacturing method.

Figure 11:
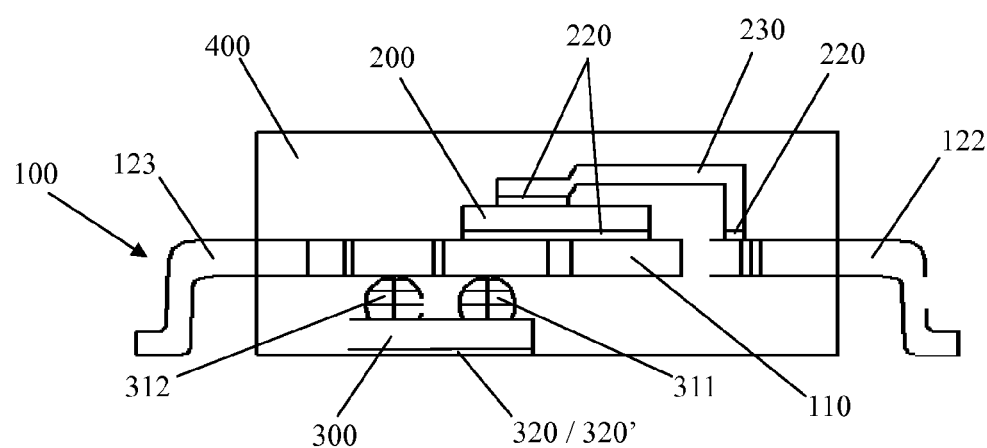
FIG. 11 is a cross-sectional view of the semiconductor device package in this invention.

FIG. 11 is a cross-sectional schematic diagram of a semiconductor package of a preferred embodiment of the present invention. As shown in FIG. 11, the semiconductor package includes a lead frame 100, a LS chip 200 connected to top side of the lead frame and a HS chip 300 connected to a bottom side of the lead frame 100. The LS and HS chips 200 and 300 are vertical MOSFET having gate and source located at the top of the chip, while drain located at the bottom of the chip.

Figure 1:
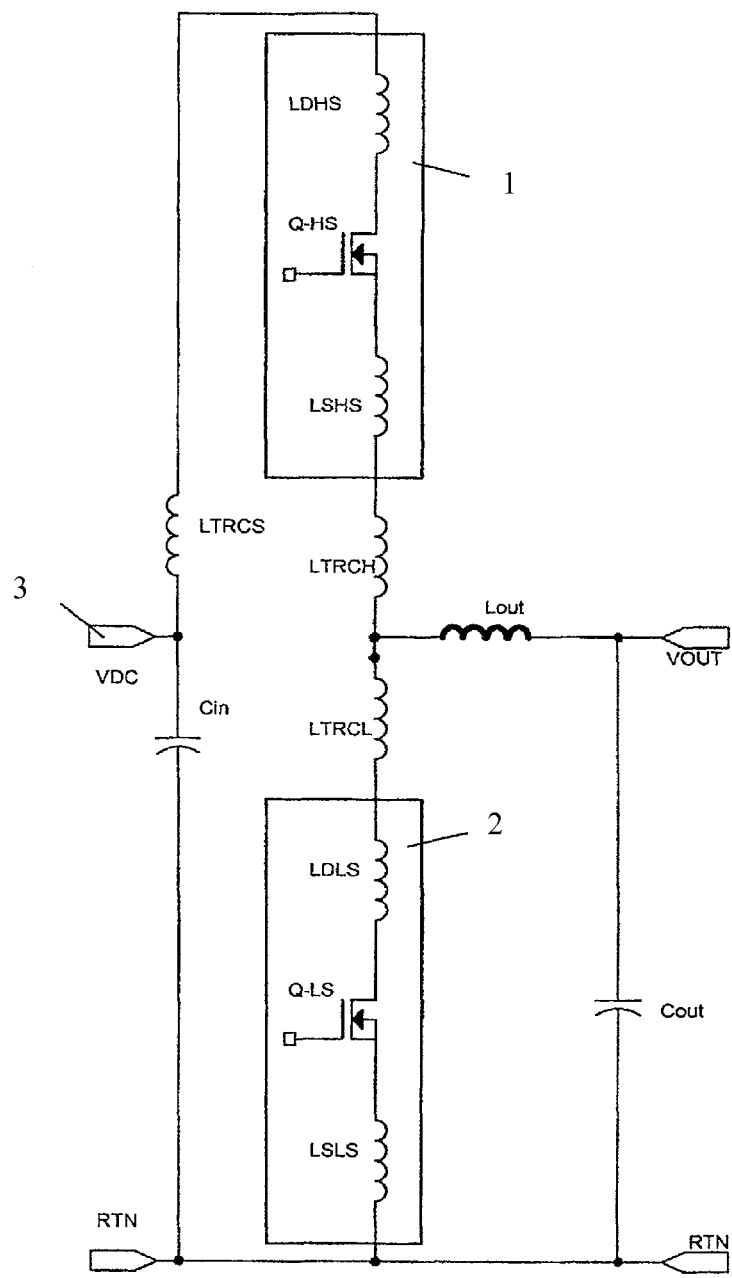
FIG. 1 is a circuit diagram of a synchronous buck converter of conventional technology with the source of HS MOSFET electrically connected to drain of LS MOSFET.
Figure 2:
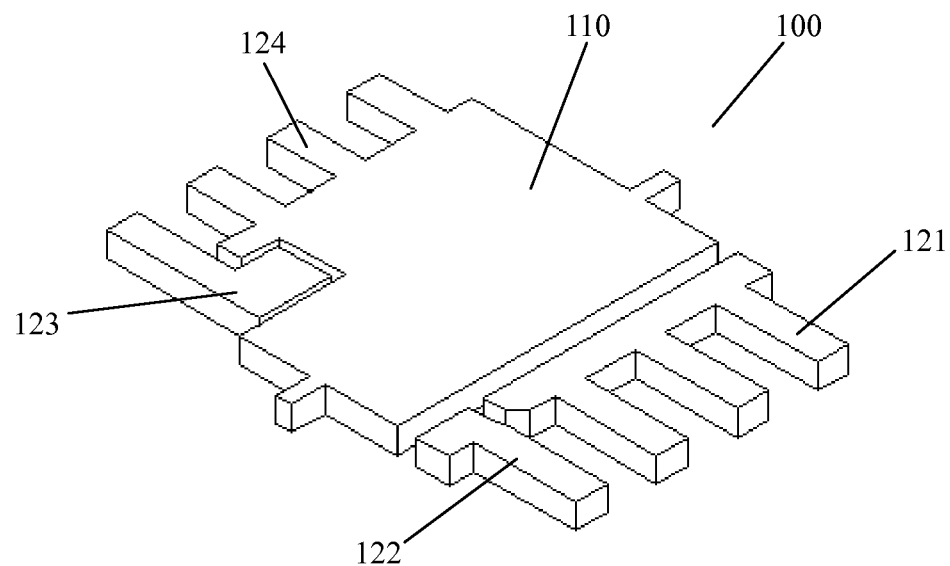
FIG. 2 is a perspective view of a lead frame of the semiconductor device with co-packaged HS and LS semiconductor chips in this invention.

As shown in FIG. 2, the lead frame 100 includes a die paddle 110 and a plurality of pins set around the die paddle 110 and are in the same plane with the die paddle 110 including the first pin 121, the second pin 122 and the third pin 123 functioning as LS source pin 121, LS gate pin 122 and HS gate pin 123 respectively and being separated and not electrically connected with the die paddle 110 and the fourth pin 124 being a part of the die paddle 110, or is an extension of die paddle 110, functioning as HS drain and LS source pin.

Figure 3:
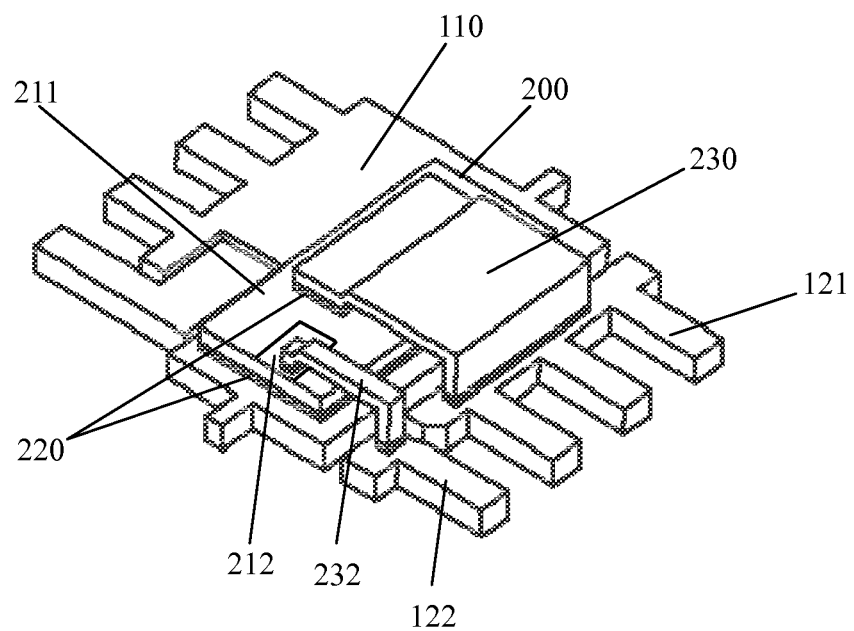
FIG. 3 is a perspective view illustrating the connection between the LS chip and the lead frame of the semiconductor device in this invention.
Figure 4:
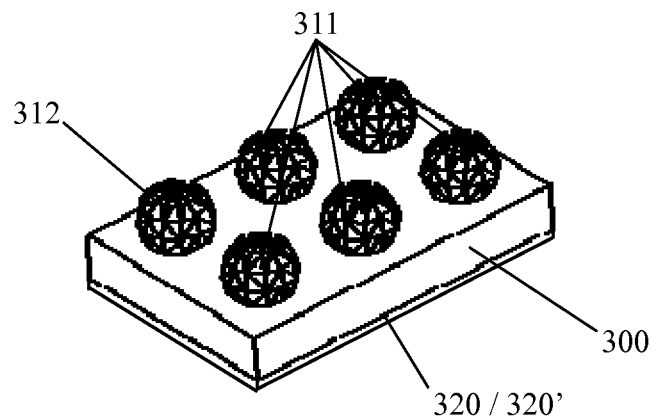
FIG. 4 is a perspective view of the HS chip of the semiconductor device in this invention.
Figure 6:
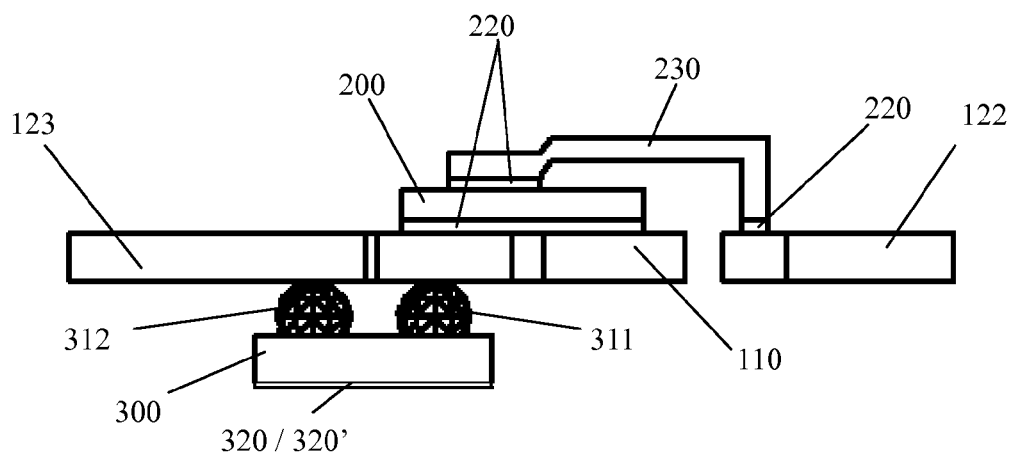
FIG. 6 is a cross-sectional view of a semiconductor device including LS and HS chips connecting respectively to the lead frame's upper and bottom surfaces in this invention.

As shown in FIG. 3, FIG. 6 and FIG. 11, the backside of the LS chip 200 is attached onto the die paddle 110 of the lead frame 100 to electrically connect its bottom drain onto the top surface of the die paddle 110. A metal clip 230 (e.g. copper clip) is used for connection between the top source 211 of the LS chip 200 and the first pin 121 of the lead frame 100. A metal clip 232 is used for connection between the top gate 212 of the LS chip 200 and the second pin 122 of the lead frame 100. The metal clips 230 and 232 can be replaced with conductive belts, conductive leads or other conductive connectors. In an alternatively embodiment, the top source 211 of the LS chip 200 is electrically connected to the first pin 121 on lead frame 100 via a metal clip, while the top gate 212 of LS chip 200 is electrically connected to the second pin 121 of lead frame 100 via a bonding wire. The metal clips 230 and 232 are connected to the LS chip 200 and pins 121 and 122 by a high temperature alloy 220.

As shown in FIG. 4, FIG. 5, FIG. 6, and FIG. 11, a plurality of solder balls 311 and 312 are formed correspondingly at gate and source on top of the HS chip 300. The solder balls can be made from low temperature alloys. A metal layer 320 is formed on backside of the LS chip 300 via evaporation or sputtering of metal composition such as Ti/Ni/Ag (titanium/nickel/silver). Alternatively, a conductive layer 320' is deposited on the backside of the HS chip 300. The HS chip 300 is attached onto the backside of the lead frame 100, so that the source balls 311 are electrically connected to the backside of the die paddle 110, and the gate balls 312 are electrically connected to the third pin 123. As described above, source of HS chip 300 and drain of LS chip 200 are separately connected to the backside and front side of the die paddle 110 respectively, which are connected with the external devices through the fourth pin 124.

Figure 7:
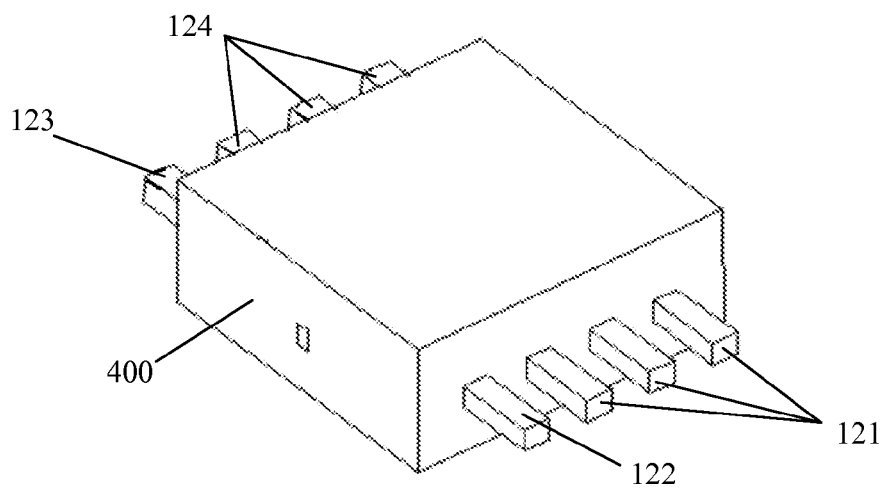
FIG. 7 is a perspective view from the front side of the semiconductor device package in this invention.
Figure 8:
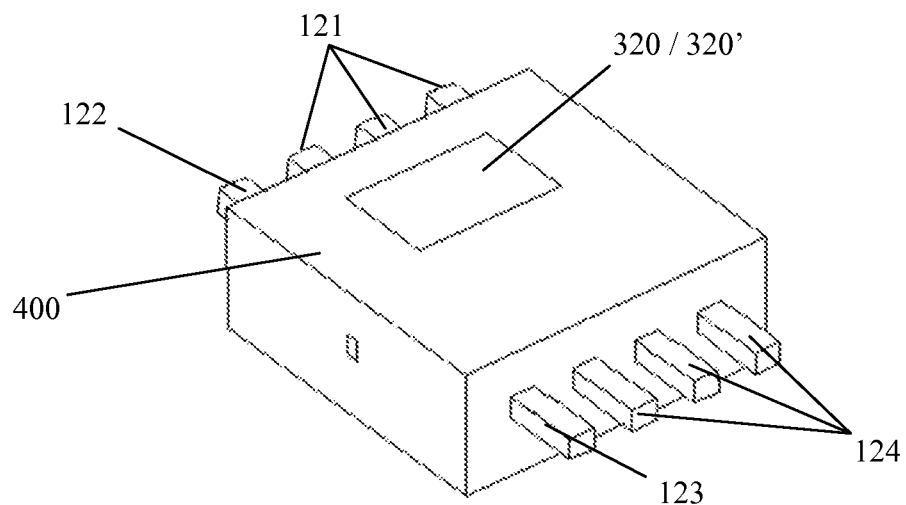
FIG. 8 is a perspective view from back side of the semiconductor device package in this invention.
Figure 9:
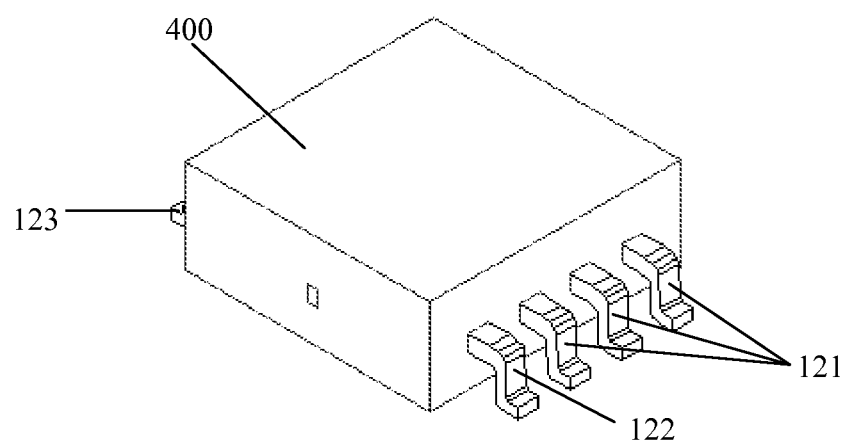
FIG. 9 is a perspective view from the front side of the semiconductor device package with bending pins.
Figure 10:
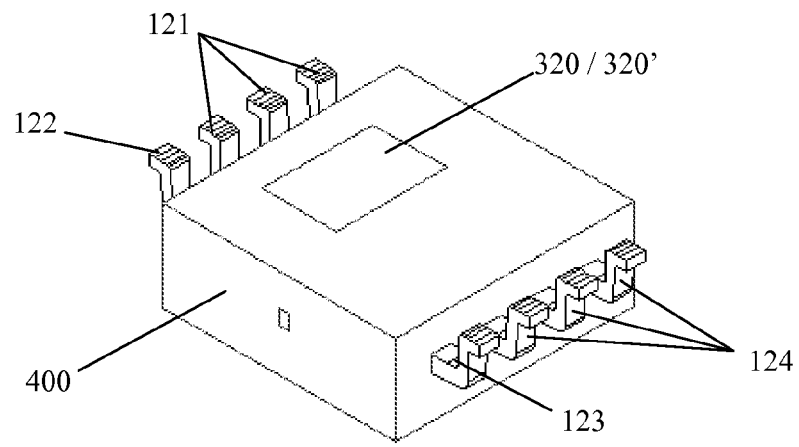
FIG. 10 is a perspective view from back side of the semiconductor device package with bending pins.

As shown in FIG. 6 to FIG. 11, the LS chip 200, die paddle 110 of lead frame 100, and HS chip 300 are co-packaged with a molding compound to form a semiconductor package 400. The vertical stacked structure of the HS and LS chips and the die paddle reduces the size of the package 400. At this point, the end part of each of the pins 121, 122, 123, 124 exposed out of the package 400 is bent to the same plane with the backside of device (FIGS. 9, 10 and 11). In addition, the metal layer 320 or 320' on back of the HS chip 300 provides the protection for its bottom drain and is exposed out from backside of the device (FIGS. 8 and 10) for electrical connection between the bottom drain of the HS chip 300 and the external devices and for heat dissipation. In a preferred embodiment, metal clip 230, which connects top source 211 of LS chip 200 and the first pin 121 of lead frame 100, has a top surface exposed out from the package 400 (not shown) to further improve the heat dissipation of the device.

The present invention also proposes a manufacturing method of the semiconductor package 400. A lead frame 100 made of conductive materials is firstly provided, as shown in FIG. 2, which includes a die paddle 110, first, second, and third pins 121, 122, 123 separated from the die paddle 110, and the fourth pin 124 connected to the die paddle 110. A plurality of LS semiconductor chips 200 are formed on a first semiconductor wafer (not shown), with the gates and sources of all LS chips 200 formed on the front side of the wafer, and drains of all LS chips formed on backside of the semiconductor wafer. Individual LS chips 200 are then singulated from the semiconductor wafer.

Similarly, a plurality of HS semiconductor chips 300 are formed on a second semiconductor wafer (not shown) with gates and sources of all HS chips 300 formed on the front side of the wafer and drains of all HS chips formed on backside of the wafer. A plurality of conductive solder balls 311 and 312 are formed correspondingly on source and gate at front side of the HS chip 300. A metal layer 320 are formed on backside of the HS chip 300, or the backside of the semiconductor wafer, by evaporation or sputtering of Ti/Ni/Ag (titanium/nickel/silver) or by attaching a conductive metal layer 320' on backside of the HS chip 300. Individual HS chips are then singulated from the semiconductor wafer.

The backside of the LS chip 200 is attached on the front side of the lead frame 100, as shown in FIG. 3, with its bottom drain electrically connected on top surface of the die paddle 110, for example by an high temperature alloy 220, while its source and gate electrically connected to the first pin 121 and the second pin 122 of the lead frame respectively via metal clips 230, 232 and the high temperature alloy 220.

Figure 5:
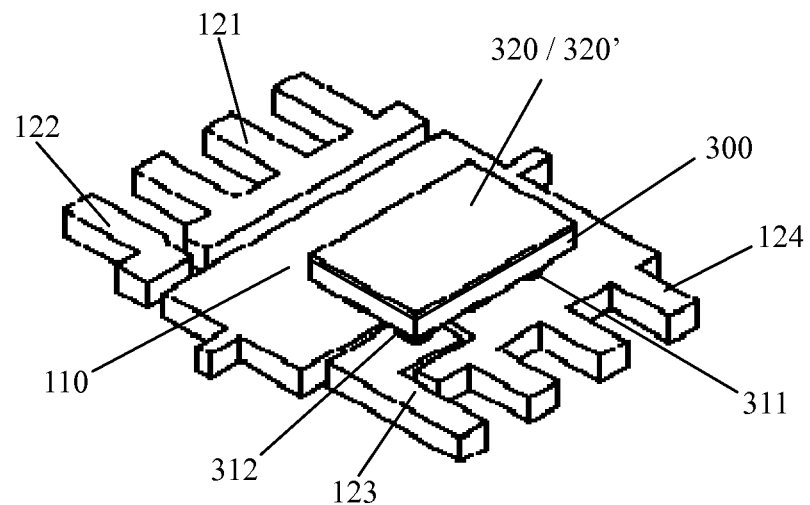
FIG. 5 is a perspective view illustrating connection between the HS chip and the lead frame in the semiconductor device in this invention.

The HS chip 300 with the solder balls 311, 312 is attached on backside of the lead frame 100, as shown in FIG. 5, so that its top source is electrically connected to the bottom surface of the die paddle 110 via the source balls 311 and the its top gate is electrically connected to the third pin 123 of lead frame 100 via the gate balls 312.

The LS chip 200, die paddle 110 of lead frame 100, and HS chip 300 are co-packaged with a molding compound to form a semiconductor package 400, as shown in FIG. 7 and FIG. 8, so that the metal layer 320 or 320' on backside of the HS chip 300 is exposed out of the package 400 for electrical connection between the bottom drain of the HS chip and the external devices and for heat dissipation. In a preferred embodiment, a top surface of the metal clip 230, which connects top source 211 of LS chip 200 and the first pin 121 of lead frame 100, is exposed out from the package 400 (not shown) to further improve the heat dissipation of the device. Individual packages 400 are singulated to expose the pins 121, 122, 123 and 124 out from the package 400. The end of exposed pins 121, 122, 123 and 124 are then bent so that the end of exposed pins 121, 122, 123 and 124 are on the same plane with the backside of the package 400 as shown in FIGS. 9-11.

The steps of the above method can be implemented in different orders. For example, the HS chip is attached to the backside of the lead frame before the LS chip is attached on the front side of the lead frame. In the semiconductor device in this invention the LS chip and HS chip are vertically stacked at top and bottom sides of the lead frame forming a three-dimensional stacked structure, thus reduces the package's size compared to the package with side by side arrangement of LS and HS chips on one side of a lead frame in existing technology. In addition, the exposed backside of the HS chip at the back surface of the package improves the heat dissipation. Furthermore, the exposed surface of the metal clip that connects the top source of the LS chip and the lead frame at the package's top surface further improves the heat dissipation of the device.

Although the contents of this invention have been described in detail in the above preferred embodiments, it should be recognized that the above description shall not be considered as a limitation to this invention. After reading the above description by technical personnel in this field, a number of modifications and replacements for this invention will be obvious. Therefore, the scope of protection for this invention shall be subject to the attached claims.

The invention claimed is:

1. A manufacturing method of a semiconductor package including co-packaged HS and LS semiconductor chips, the method comprises the following steps:
   providing a lead frame made of conductive materials, the lead frame comprises a die paddle;
   forming a plurality of LS semiconductor chips on a first semiconductor wafer, wherein each LS semiconductor chip comprises a top source and a top gate on a front side of the first semiconductor wafer and a bottom drain on a backside of the semiconductor wafer; and singulating individual LS semiconductor chips from the first semiconductor wafer;
   forming a plurality of HS semiconductor chips on a second semiconductor wafer, wherein each HS semiconductor chip comprises a top source and a top gate on a front side of the second semiconductor wafer and a bottom drain on a backside of the second semiconductor wafer; depositing a plurality of conductive source balls and conductive gate balls on top source and top gate of the HS semiconductor chip correspondingly; and singulating the individual HS semiconductor chips from the second semiconductor wafer;
   attaching the LS semiconductor chip on the front side of the lead frame to electrically connect its bottom drain on a top surface of the die paddle;
   flipping over the lead frame and flipping and attaching the HS semiconductor chip on the backside of lead frame to electrically connect its top source to the bottom surface of the die paddle through the plurality of conductive source balls and thus to electrically connect its top source to the bottom drain of the LS semiconductor chip;

encapsulating the LS semiconductor chip, the die paddle of the lead frame, and the HS semiconductor chip with a molding compound forming the semiconductor package, wherein the backside of the HS semiconductor chip is exposed from a backside of the semiconductor package for electrical connection between its bottom drain and external devices and for heat dissipation; and separating individual semiconductor packages from the lead frame.

2. The manufacturing method of claim 1, where the step of forming a plurality of HS semiconductor chips on a second semiconductor wafer further comprises forming a metal layer with a designed thickness on the backside of the HS semiconductor chip via evaporation or sputtering a metal composition on the backside of the HS semiconductor chip or depositing a conductive metal layer on the backside of the HS semiconductor chip with the metal layer exposed from the semiconductor package.

3. The manufacturing method of claim 1, wherein the lead frame further includes first, second, and third pins separated and not electrically connected with the die paddle, and the fourth pin electrically connected to the die paddle.

4. The manufacturing method of claim 3, wherein the top source and top gate of the LS semiconductor chip are connected to the first pin and the second pin through first and second metal clips respectively.

5. The manufacturing method of claim 3, wherein the top source of the HS semiconductor chip is electrically connected to the third pin of the lead frame via the plurality of conductive gate balls.

6. The manufacturing method of claim 3, wherein the bottom drain of the LS semiconductor chip and the top source of the HS semiconductor chip are respectively connected to the top surface and the bottom surface of the die paddle that electrically connects to the external devices via the fourth pin.

7. The manufacturing method of claim 4, wherein high temperature alloys is used for electrical connection between the LS semiconductor chip and the die paddle, between the first and second metal clips and the LS semiconductor chip, and between the first and second metal clips and the first pin, the second pin.

8. The manufacturing method of claim 1, wherein the conductive source and gate balls are made of low temperature alloys.

* * * * *